United States Patent
Bae et al.

(10) Patent No.: US 11,264,444 B2
(45) Date of Patent: Mar. 1, 2022

(54) DISPLAY APPARATUS INCLUDING AN AMORPHOUS SILICON CONDUCTIVE LAYER AND METHOD OF MANUFACTURING THE SAME

(71) Applicant: SAMSUNG DISPLAY CO., LTD., Yongin-si (KR)

(72) Inventors: Injun Bae, Seoul (KR); Junhee Lee, Hwaseong-si (KR); Woori Seo, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 242 days.

(21) Appl. No.: 16/710,970

(22) Filed: Dec. 11, 2019

(65) Prior Publication Data

US 2020/0194533 A1 Jun. 18, 2020

(30) Foreign Application Priority Data

Dec. 12, 2018 (KR) .................. 10-2018-0159823

(51) Int. Cl.
*H01L 27/32* (2006.01)
*H01L 51/56* (2006.01)

(52) U.S. Cl.
CPC .......... *H01L 27/3276* (2013.01); *H01L 51/56* (2013.01); *H01L 2227/323* (2013.01)

(58) Field of Classification Search
CPC .......................... H01L 27/3276; H01L 51/56
See application file for complete search history.

(56) References Cited

U.S. PATENT DOCUMENTS

| 8,045,084 | B2 * | 10/2011 | Baek | ................. G02F 1/136259 |
| | | | | 349/54 |
| 9,136,315 | B1 * | 9/2015 | Kim | ..................... H01L 27/3211 |
| 9,978,826 | B2 * | 5/2018 | Park | ..................... H01L 27/3248 |
| 2020/0168688 | A1 * | 5/2020 | Lee | ..................... H01L 27/3258 |
| 2021/0296424 | A1 * | 9/2021 | Cho | ..................... H01L 27/3276 |

FOREIGN PATENT DOCUMENTS

| JP | 2001-203470 | 7/2001 |
| JP | 2002-093941 | 3/2002 |
| KR | 10-2018-0080741 | 7/2018 |

* cited by examiner

*Primary Examiner* — Douglas M Menz

(74) *Attorney, Agent, or Firm* — F. Chau & Associates, LLC

(57) ABSTRACT

A display apparatus includes a base substrate. A first data line is disposed on the base substrate. A first insulating layer is disposed on both the data line and the base substrate. An amorphous silicon conductive layer is disposed on the first insulating layer. A second insulating layer is disposed on the amorphous silicon conductive layer. A second data line is disposed on the second insulating layer.

20 Claims, 12 Drawing Sheets

DISPLAY APPARATUS INCLUDING AN AMORPHOUS SILICON CONDUCTIVE LAYER AND METHOD OF MANUFACTURING THE SAME

This application claims priority under 35 U.S.C. § 119 to, and the benefit of, Korean Patent Application No. 10-2018-0159823, filed on Dec. 12, 2018, the contents of which are herein incorporated by reference in their entirety.

TECHNICAL FIELD

The present disclosure relates to a display apparatus and, more specifically, to a display apparatus having an amorphous silicon conductive layer and a method of manufacturing the display apparatus.

DISCUSSION OF THE RELATED ART

Modern display apparatuses are known for being thin, light, and consuming little power, especially when compared to legacy display technologies such as a cathode ray tube (CRT) display apparatus. Examples of modern display technologies include a plasma display apparatus, a liquid crystal display apparatus, and an organic light emitting display apparatus.

The display apparatus includes a plurality of pixels for displaying an image, and signal lines such as a plurality of data lines and scan lines, which are electrically connected to the pixels to provide a data signal and a scan signal thereto. As the display apparatus is designed to display images of higher-resolutions, a width of each of the signal lines and an interval between the signal lines becomes narrow. This arrangement may tend to increase parasitic capacitance and line resistance between the signal lines, which may degrade image quality.

SUMMARY

A display apparatus includes a base substrate. A first data line is disposed on the base substrate. A first insulating layer is disposed on both the data line and the base substrate. An amorphous silicon conductive layer is disposed on the first insulating layer. A second insulating layer is disposed on the amorphous silicon conductive layer. A second data line is disposed on the second insulating layer.

A display apparatus includes a base substrate. A first thin film transistor and a second thin film transistor are each disposed on the base substrate. A thin film transistor insulating layer is disposed on both the first and second thin film transistors. A first data line is disposed on the thin film transistor insulating layer. A first insulating layer is disposed on the first data line and is electrically connected to the first thin film transistor. An amorphous silicon conductive layer is disposed on the first insulating layer. A second insulating layer is disposed on the amorphous silicon conductive layer. A second data line is disposed on the second insulating layer and is electrically connected to the second thin film transistor.

A method of manufacturing a display apparatus includes forming first and second thin film transistors on a base substrate. A thin film transistor insulating layer is formed on the base substrate on which the first and second thin film transistors are formed. A first data pattern, comprising a first data line, is formed on the thin film transistor insulating layer. A first insulating layer is formed on the first data pattern. An amorphous silicon layer is formed on the first insulating layer. A second insulating layer is formed on the amorphous silicon layer. An amorphous silicon conductive layer is formed by doping the amorphous silicon layer with an impurity. A second data pattern, comprising a second data line, is formed on the second insulating layer.

BRIEF DESCRIPTION OF THE DRAWINGS

A more complete appreciation of the present disclosure and many of the attendant features thereof will become more apparent by describing in detail exemplary embodiments thereof with reference to the accompanying drawings, in which.

DETAILED DESCRIPTION

Figure 1:
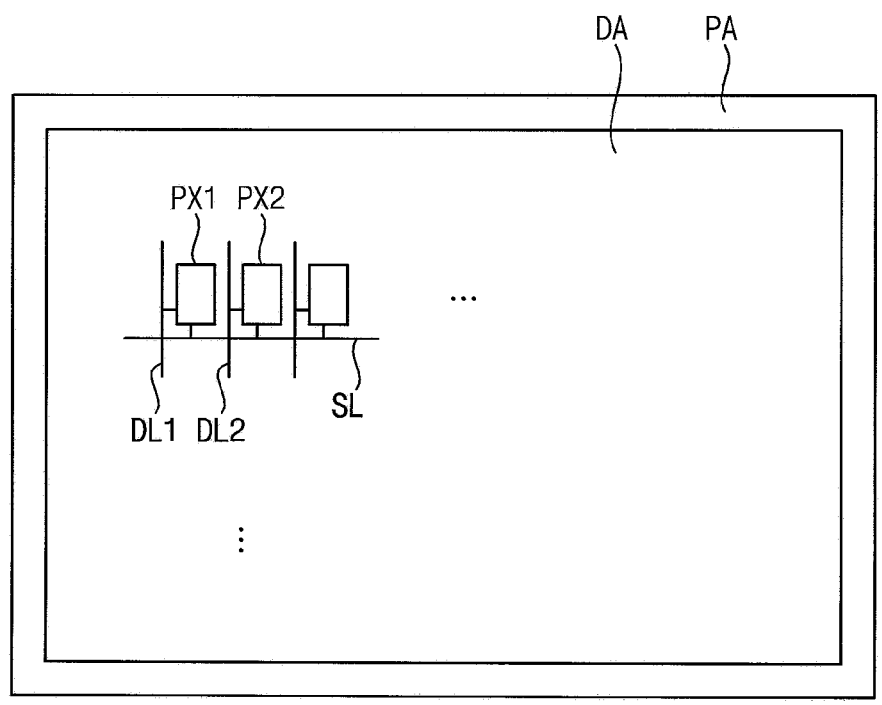
FIG. 1 is a plan view illustrating a display apparatus according to an exemplary embodiment of the inventive concept.
Figure 1:
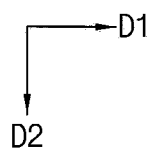

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

FIG. 1 is a plan view illustrating a display apparatus according to an exemplary embodiment of the inventive concept.

Referring to FIG. 1, the display apparatus may include a display area DA in which an image is displayed and a peripheral area PA that is a non-display area, the peripheral area at least partially surrounding the display area DA.

The display apparatus may include a plurality of pixels arranged in a matrix form along a first direction D1 and a second direction D2 perpendicular to the first direction D1. While it is understood that there may be a very large number of pixels within the display apparatus, two pixels PX1 and PX2 are named for illustrative purposes. It is to be understood that the other pixels may have similar properties to those described with respect to pixels PX1 and PX2. Scan lines SL and data lines DL1 and DL2 may be electrically connected to the pixels PX1 and PX2, respectively. It is to be understood that there may be many additional scan lines and many additional data lines with two data lines DL1 and DL2 being named for illustrative purposes.

A scan signal may be applied to the scan lines SL and a data signal may be applied to the data lines DL1 and DL2. A first data signal may be applied to the first data line DL1 and a second data signal different from the first data signal may be applied to the second data line DL2.

The first data line DL1 and the second data line DL2 may each extend primarily in the second direction D2. The scan line SL may extend primarily in the first direction D1.

In the peripheral area PA, driving circuits and wirings for driving the pixels PX1 and PX2 may be arranged. The driving circuit for driving the pixels and the pixel circuits constituting the pixels may have various structures.

Figure 2A:
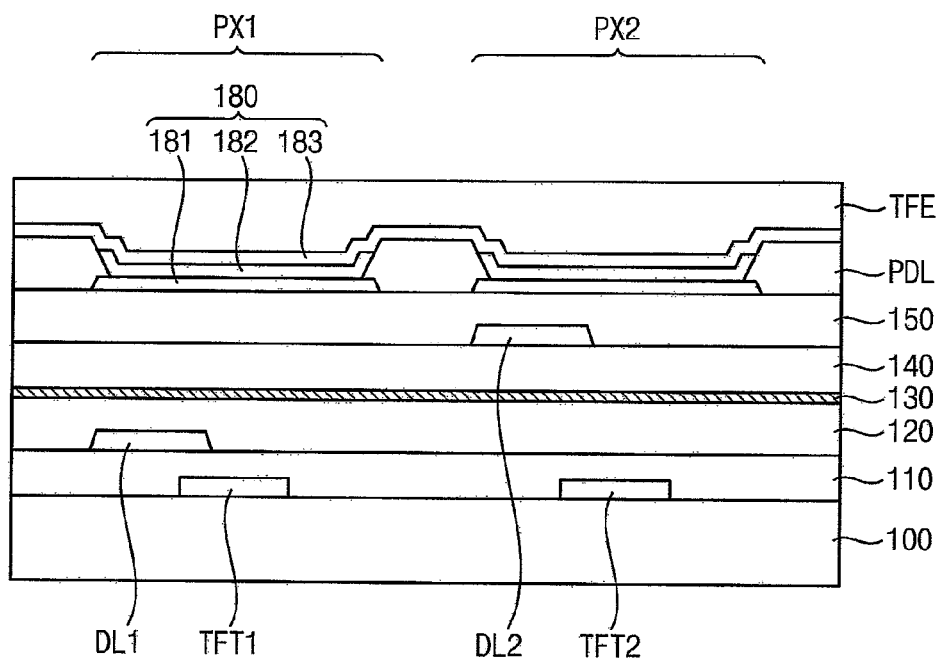
FIG. 2A is a cross-sectional view of first and second pixels PX1 and PX2 of the display apparatus of FIG. 1.
Figure 2B:
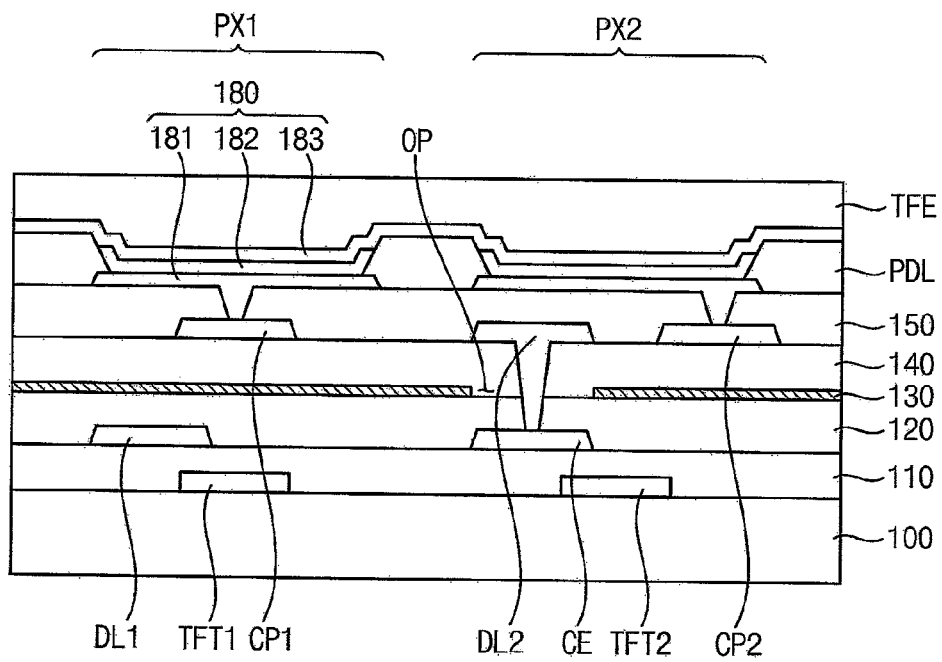
FIG. 2B is a cross-sectional view illustrating a connection between a second data line DL 2 and a connecting electrode CE of the display apparatus of FIG. 1.

FIG. 2A is a cross-sectional view of first and second pixels PX1 and PX2 of the display apparatus of FIG. 1. FIG. 2B is a cross-sectional view illustrating a connection between a second data line DL 2 and a connecting electrode CE of the display apparatus of FIG. 1.

Referring to FIGS. 2A and 2B, the display apparatus may include a base substrate 100, a first thin film transistor TFT1, a second thin film transistor TFT2, a thin film transistor insulating layer 110, a first data pattern, a first insulating layer 120, an amorphous silicon conductive layer 130, a second insulating layer 140, a second data pattern, a via insulating layer 150, a pixel defining layer PDL, a light emitting structure, and a thin film encapsulation layer TFE.

The base substrate 100 may include transparent or opaque insulation materials. For example, the base substrate 100 may include a quartz substrate, a synthetic quartz substrate, a calcium fluoride substrate, a fluoride-doped quartz substrate, a sodalime glass substrate, a non-alkali glass substrate etc. Alternatively, the base substrate 100 may include a flexible transparent material such as a flexible transparent resin substrate (e.g., a polyimide substrate). The flexible transparent substrate may be configured to bend to a noticeable extent without incurring damage thereby. In this case, the polyimide substrate may include a first polyimide layer, a barrier film layer, a second polyimide layer, etc. For example, the polyimide substrate may have a configuration where the first polyimide layer, the barrier film layer, and the second polyimide layer, are stacked on a rigid glass substrate.

The first thin film transistor TFT1 and the second thin film transistor TFT2 may each be disposed on the base substrate 100. The first thin film transistor TFT1 may be a thin film transistor included in the first pixel PX1 and may be a driving transistor for driving the light emitting structure of the first pixel PX1. The second thin film transistor TFT2 may be a thin film transistor included in the second pixel PX2 adjacent to the first pixel PX1 and may be a driving transistor for driving the light emitting structure of the second pixel PX2.

The first and second thin film transistors TFT1 and TFT2 may each be elements such as an amorphous silicon thin film transistor, a polysilicon thin film transistor, and/or an oxide semiconductor thin film transistor, but the present invention is not limited thereto.

The thin film transistor insulating layer 110 may be disposed on the base substrate 100 on which the first and second thin film transistors TFT1 and TFT2 are disposed. The thin film transistor insulating layer 110 may sufficiently cover the first and second thin film transistors TFT1 and TFT2 on the base substrate 100 and may have a substantially flat upper surface that is free of a step around the first and second thin film transistors TFT1 and TFT2. Alternatively, the thin film transistor insulating layer 110 may cover the first and second thin film transistors TFT1 and TFT2 on the base substrate 100, and may be disposed as a substantially uniform thickness along a profile of the first and second thin film transistors TFT1 and TFT2 so as to form a step over each of the thin firm transistors TFT1 and TFT2.

The thin film transistor insulating layer 110 may include an inorganic insulating material such as a silicon compound, a metal oxide, or the like. The thin film transistor insulating layer 110 may be formed of a plurality of layers.

The first data pattern may be disposed on the thin film transistor insulating layer 110. The first data pattern may include a first data line DL1 and a connecting electrode CE. The first data pattern may be formed to include a single metal, an alloy, a metal nitride, a conductive metal oxide, a transparent conductive material, or the like.

The first data line DL1 may be electrically connected to the first thin film transistor TFT1. For example, the first data line DL1 may be electrically connected to the first thin film transistor TFT1 through a contact hole formed through the thin film transistor insulating layer 110.

The connecting electrode CE may be electrically connected to the second thin film transistor TFT2. For example, the connecting electrode CE may be electrically connected to the second thin film transistor TFT2 through a contact hole formed through the thin film transistor insulating layer 110.

The first insulating layer 120 may be disposed on the connecting electrode CE. The first insulating layer 120 may be formed of an inorganic and/or organic insulating material.

The amorphous silicon conductive layer 130 may be disposed on the first insulating layer 120. The amorphous silicon conductive layer 130 may be formed over an entirety of the base substrate 100 except for a portion where a contact structure for connection of circuit wirings is formed. Therefore, the amorphous silicon conductive layer 130 may overlap the first data line DL1, a second data line DL2 which will be mentioned later, the first thin film transistor TFT1, and the second thin film transistor TFT2. The amorphous silicon conductive layer 130 may be formed by doping an impurity into the amorphous silicon layer to increase the conductivity thereof.

A constant voltage of a certain level such as a ground voltage may be applied to the amorphous silicon conductive layer 130. Since the amorphous silicon conductive layer 130 is disposed between the second data line DL2 and the first data line DL1, which is the data line closest to the second data line DL2, and the constant voltage is applied thereto, the amorphous silicon conductive layer 130 may have a shielding effect for blocking a parasitic capacitance generated between the first data line DL1 and the second data line DL2.

When a general metal thin film is used in place of the amorphous silicon conductive layer, the metal thin film should be formed to correspond to the entirety of the base substrate 100. Therefore, an arcing phenomenon, in which electricity jumps across an open circuit, due to the buildup of a large amount of charge may occur during a deposition process such as a chemical vapor deposition (CVD) process. However, according to the present embodiment, since the amorphous silicon conductive layer 130 is formed by doping impurities into the amorphous silicon layer after the amorphous silicon layer is formed, a high quality display apparatus can be manufactured without any problems such as arcing from occurring during the manufacturing process.

The amorphous silicon conductive layer 130 may have an opening OP for connection between the second data line DL2 and the connecting electrode CE.

The second insulating layer 140 may be disposed on the amorphous silicon conductive layer 130. The second insulating layer 140 may be formed of an inorganic and/or organic insulating material.

The second data pattern may be disposed on the second insulating layer 140. The second data pattern may include a first contact pad CP1, a second data line DL2, and a second contact pad CP2. The second data pattern may be formed to include a single metal, an alloy, a metal nitride, a conductive metal oxide, a transparent conductive material, or the like.

The second data line DL2 may be electrically connected to the second thin film transistor TFT1. The second data line DL2 may be electrically connected to the connecting electrode CE through a contact hole formed through the second insulation layer 140 and the first insulation layer 130. The contact hole may be formed through the opening OP of the amorphous silicon conductive layer 130 and might not be in contact with the amorphous silicon conductive layer 130.

The first contact pad CP1 and the second contact pad CP2 may be formed so as to be included in the first pixel PX1 and the second pixel PX2, respectively, and may be electrically connected to the first thin film transistor TFT1 and the second thin film transistor TFT2, respectively.

The via insulating layer 150 may be disposed on the second insulating layer 140 on which the second data pattern is disposed. The via insulating layer 150 may have a single-layer structure, but may alternatively have a multi-layer structure including at least two insulating layers. The via insulating layer 150 may be formed using an organic material such as a photoresist, an acrylic resin, a polyimide resin, a polyamide resin, and/or a siloxane-based resin.

The light emitting structure 180 may be formed so as to correspond to each pixel, and only the light emitting structure corresponding to the first pixel PX1 will be described for convenience of explanation. It is to be assumed that the features and elements not described herein are at least similar to corresponding features and elements that are described elsewhere in the specification.

The light emitting structure 180 may include a first electrode 181, an emission layer 182 and a second electrode 183.

The first electrode 181 may be disposed on the via insulation layer 150. The first electrode 181 may include a reflective material or a transmissive material in accordance with the emission type of the display apparatus. According to exemplary embodiments of the present disclosure, the first electrode 181 may have a single layer structure or a multi layer structure, which may include a single metal film, an alloy film, a metal nitride film, a conductive metal oxide film and/or a transparent conductive film.

The pixel defining layer PDL may be disposed on the via insulation layer 150 on which the first electrode 181 is disposed. The pixel defining layer PDL may be formed using an organic material. For example, the pixel defining layer PDL may include photoresist, acryl-based resin, polyimide-based resin, polyamide-based resin, siloxane-based resin, etc. In some exemplary embodiments of the present disclosure, an opening which exposes the first electrode 181 may be formed by etching the pixel defining layer PDL. An emitting area and a non-emitting area of the display apparatus may be defined by the opening of the pixel defining layer PDL. For example, a portion where the opening of the pixel defining layer PDL is located may correspond to an emitting area, and a non-emitting area may correspond to a portion adjacent to the opening of the pixel defining layer PDL.

The light emitting layer 182 may be disposed on the first electrode 181 exposed through the opening of the pixel defining layer PDL. In addition, the light emitting layer 182 may extend on a sidewall of the opening of the pixel defining layer PDL. In some exemplary embodiments of the present disclosure, the light emitting layer 182 may include an organic light emitting layer (EL), a hole injection layer (HIL), a hole transfer layer (HTL), an electron transfer layer (ETL), an electron injection layer (EIL), etc. In some exemplary embodiments of the present disclosure, except for the organic emission layer, the hole injection layer, the hole transport layer, the electron transport layer, and the electron injection layer may be formed in common to correspond to a plurality of pixels. In some exemplary embodiments of the present disclosure, a plurality of organic light emitting layers may be formed using light emitting materials for generating different colors of light such as light emitting materials for generating red light, light emitting materials for generating green light, and light emitting materials for generating blue light, in accordance with color pixels of the display device. In some exemplary embodiments of the present disclosure, the organic light emitting layer of the light emitting layer 182 may include a plurality of stacked light emitting materials for generating red light, green light, and blue light to thereby emit white light. Here, elements of the light emitting layer 182 are commonly formed so as to correspond to a plurality of pixels, and each pixel can be divided by a color filter layer.

The second electrode 183 may be disposed on the pixel defining layer PDL and the light emitting layer 182. The second electrode 183 may include a transmissive material or a reflective material in accordance with the emission type of the display device. In exemplary embodiments of the present disclosure, the second electrode 183 may also have a single layer structure or a multi layer structure, which may include a metal film, an alloy film, a metal nitride film, a conductive metal oxide film and/or a transparent conductive film.

The thin film encapsulation layer TFE may be disposed on the second electrode 183. The thin film encapsulation layer TFE may prevent penetration of moisture and oxygen from the outside. The thin film encapsulation layer TFE may include at least one organic layer and at least one inorganic layer. The at least one organic layer and the at least one inorganic layer may be alternately stacked with each other. For example, the thin film encapsulation layer TFE may include two inorganic layers and one organic layer therebetween, but is not limited thereto. In some exemplary embodiments of the present disclosure, it is possible to provide a sealing substrate for shielding outside air and moisture from penetrating into the display apparatus instead of the thin film encapsulation layer TFE.

Although only the first data line DL1 and the second data line DL2 are illustrated in the drawing, the display apparatus may include a plurality of pixels and a plurality of data lines corresponding thereto, and the first data line DL1 and the second data line DL2 may be alternately arranged on different layers such as the first data line DL1 and the second data line DL2 to maximize intervals between the data lines. Thus, influence of the data lines can be minimized along with the shielding effect of the amorphous silicon conductive layer 130.

Figure 3:
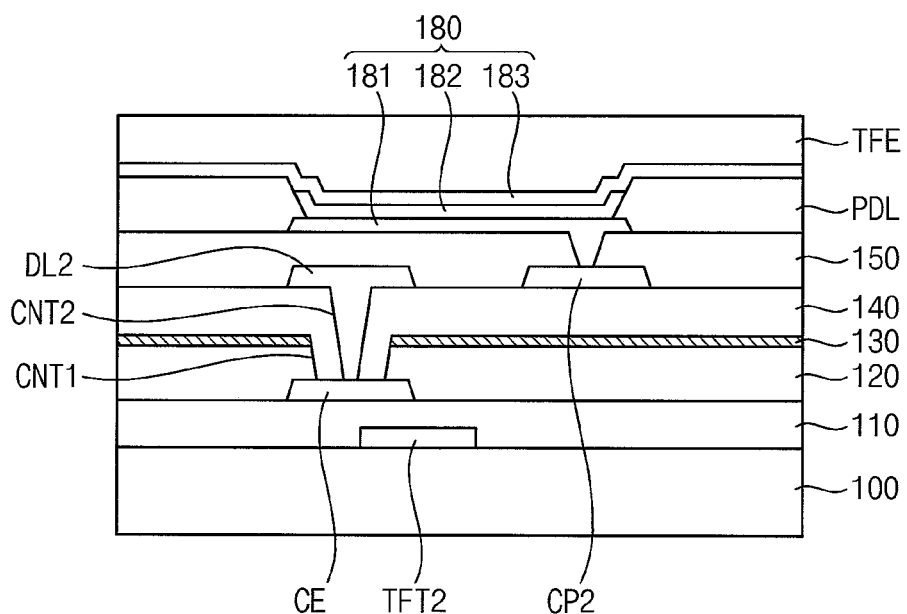
FIG. 3 is a cross-sectional view corresponding to one pixel of a display apparatus according to an exemplary embodiment of the inventive concept.

FIG. 3 is a cross-sectional view corresponding to one pixel of a display apparatus according to an exemplary embodiment of the inventive concept.

Referring to FIG. 3, the display apparatus may be substantially the same as the display apparatus of FIGS. 1 to 2B except for a connection structure between a second data line DL and a connecting electrode CE by a first contact hole CNT1 and a second contact hole CNT2. Therefore, repeated explanation is omitted and to the extent that an explanation of various elements and features have been omitted, it may be assumed that these elements and features are at least similar to corresponding elements and features described elsewhere in the specification.

The display apparatus may include a base substrate 100, a first thin film transistor, a second thin film transistor TFT2, a thin film transistor insulating layer 110, a first data pattern, a first insulating layer 120, an amorphous silicon conductive layer 130, a second insulating layer 140, a second data pattern, a via insulating layer 150, a pixel defining layer PDL, a light emitting structure, and a thin film encapsulation layer TFE.

The base substrate 100 may include transparent or opaque insulation materials. The first thin film transistor and the second thin film transistor TFT2 may be disposed on the base substrate 100. The thin film transistor insulating layer 110 may be disposed on the base substrate 100 on which the first and second thin film transistors TFT2 are disposed.

The first data pattern may be disposed on the thin film transistor insulating layer 110. The first data pattern may include a first data line and a connection electrode CE. The first insulating layer 120 may be disposed on the thin film transistor insulating layer 110 on which the first data pattern is disposed. The amorphous silicon conductive layer 130 may be disposed on the first insulating layer 120.

A first contact hole CNT1 may be formed through the amorphous silicon conductive layer 130 and the first insulating layer 120 so as to expose the connecting electrode CE.

The second insulating layer 140 may be disposed on the amorphous silicon conductive layer 130. The second insulating layer 140 may be disposed in the first contact hole CNT1 and the second contact hole CNT2. A second contact hole CNT2 may be formed in the first contact hole CNT1 through the second insulating layer 140. The second data line DL2 may be connected to the connecting electrode CE through the second contact hole CNT2.

The second insulating layer 140 may be disposed on the amorphous silicon conductive layer 130. The second data pattern may be disposed on the second insulating layer 140. The second data pattern may include a first contact pad, a second data line DL2, and a second contact pad CP2.

The via insulating layer 150 may be disposed on the second insulating layer 140 on which the second data pattern is disposed. The light emitting structure 180 may include a first electrode 181, a light emitting layer 182, and a second electrode 183. The first electrode 181 may be disposed on the via insulating layer 150. The pixel defining layer PDL may be disposed on the via insulating layer 150 on which the first electrode 181 is disposed. The light emitting layer 182 may be disposed on the first electrode 181 exposed through an opening of the pixel defining layer PDL. The second electrode 183 may be disposed on the pixel defining layer PDL and the light emitting layer 182. The thin film encapsulation layer TFE may be disposed on the second electrode 183.

Figure 4:
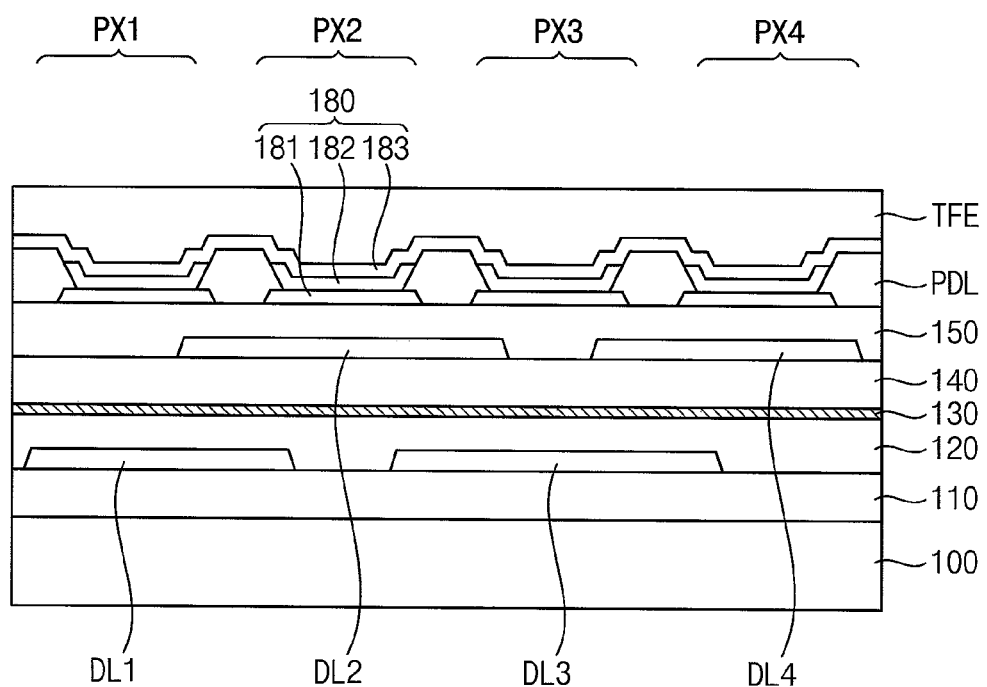
FIG. 4 is a cross-sectional view corresponding to four neighboring pixels of a display apparatus according to an exemplary embodiment of the inventive concept.

FIG. 4 is a cross-sectional view corresponding to four neighboring pixels of a display apparatus according to an exemplary embodiment of the inventive concept.

Referring to FIG. 4, the display apparatus may be substantially the same as the display apparatus of FIGS. 1 to 2B except that adjacent data lines partially overlap each other. Therefore, repeated explanation is omitted and to the extent that an explanation of various elements and features have been omitted, it may be assumed that these elements and features are at least similar to corresponding elements and features described elsewhere in the specification. The drawing shows cross sections of four neighboring pixels PX1, PX2, PX3, and PX4. However, it is again to be understood that additional pixels are present.

The display apparatus may include a base substrate 100, first through fourth thin film transistors included in the first through fourth pixels PX1 through PX4, respectively, a thin film transistor insulating layer 110, a first data pattern, a first insulating layer 120, an amorphous silicon conductive layer 130, a second insulating layer 140, a second data pattern, a via insulating layer 150, a pixel defining layer PDL, and a thin-film encapsulation layer TFE.

The base substrate 100 may be made of a transparent or opaque material. The first to fourth thin film transistors may be disposed on the base substrate 100. The thin film transistor insulating layer 110 may be disposed on the base substrate 100 on which the first to fourth thin film transistors are disposed.

The first data pattern may be disposed on the thin film transistor insulating layer 110. The first data pattern may include a first data line DL1 and a third data line DL3.

The first insulating layer 120 may be disposed on the thin film transistor insulating layer 110 on which the first data pattern is disposed. The amorphous silicon conductive layer 130 may be disposed on the first insulating layer 120. The second insulating layer 140 may be disposed on the amorphous silicon conductive layer 130.

The second data pattern may be disposed on the second insulating layer 140. The second data pattern may include a second data line DL2 and a fourth data line DL4.

The first data line DL1 and the second data line DL2, which are adjacent data lines, may partially overlap each other in a plane view. The second data line DL2 and the third data line DL3, which are adjacent data lines, may partially overlap each other in the plane view. The third data line DL3 and the fourth data line DL4, which are adjacent data lines, may partially overlap each other in the plane view.

The via insulating layer 150 may be disposed on the second insulating layer 140 on which the second data pattern is disposed.

The light emitting structure 180 may be formed corresponding to each pixel, and only the light emitting structure corresponding to the first pixel PX1 will be described for convenience of explanation. It is to be assumed that the other light emitting structures are similar.

The light emitting structure 180 may include a first electrode 181, a light emitting layer 182, and a second electrode 183. The first electrode 181 may be disposed on the via insulating layer 150. The pixel defining layer PDL may be disposed on the via insulating layer 150 on which the first electrode 181 is disposed. The light emitting layer 182 may be disposed on the first electrode 181 exposed through an opening of the pixel defining layer PDL. The second electrode 183 may be disposed on the pixel defining layer PDL and the light emitting layer 182. The thin film encapsulation layer TFE may be disposed on the second electrode 183.

According to exemplary embodiments of the present invention, since the display apparatus is arranged such that two adjacent data lines are partially overlapped with each other, the amorphous silicon conductive layer 130 having a shielding effect is disposed between the two data lines. Thus, parasitic capacitance between the data lines may be reduced or prevented even if the sizes of the respective pixels are reduced and the data lines are arranged more closely to each other. In this way, line resistance may be reduced by permitting wider data lines.

Although the data lines are arranged more closely to each other as the size of each pixel becomes smaller to accommodate a higher resolution, display quality degradation due to parasitic capacitance between the data lines can be prevented and a width of each of the data lines can be sufficiently secured to reduce a line resistance.

FIGS. 5A to 5G are cross-sectional views illustrating a method of manufacturing the display apparatus of FIGS. 1 to 3B.

Figure 5A:
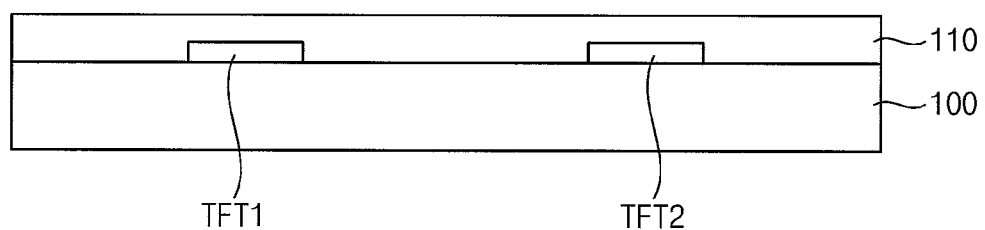
FIGS. 5A to 5G are cross-sectional views illustrating a method of manufacturing the display apparatus of FIGS. 1 to 3B.

Referring to FIG. 5A, a first thin film transistor TFT1 and a second thin film transistor TFT2 may be formed on a base substrate 100. A thin film transistor insulating layer 120 may be formed on the base substrate 100 on which the first thin film transistor TFT1 and the second thin film transistor TFT2 are formed.

Figure 5B:
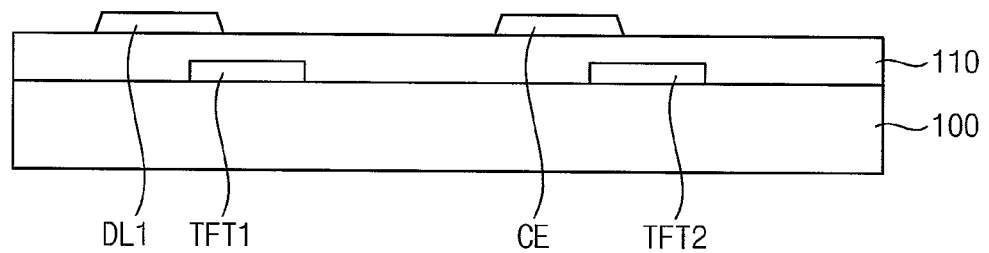

Referring to FIG. 5B, a first data pattern may be formed on the thin film transistor insulating layer 120. The first data pattern may include a first data line DL1 and a connection electrode CE. After forming the contact hole for exposing the first or second thin film transistor TFT1 through the thin film transistor insulating layer 120, the first data pattern may be formed, so that a structure electrically connected to the first or second thin film transistor TFT1 or TFT2 can be formed.

Figure 5C:
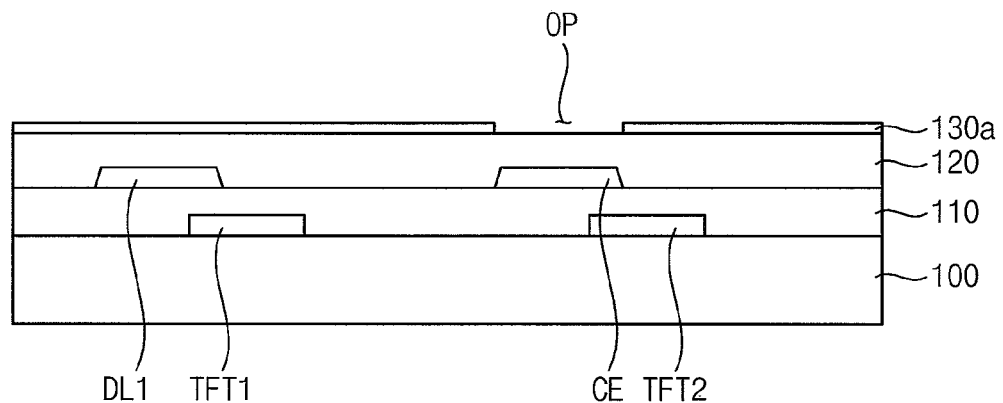

Referring to FIG. 5C, the first insulating layer 120 may be formed on the thin film transistor insulating layer 110 on which the first data pattern is formed. The first insulating layer 120 may include an inorganic insulating material and may be formed through a deposition process such as chemical vapor deposition (CVD)

An amorphous silicon layer 130a having an opening OP may be formed on the first insulating layer 120. The amorphous silicon layer 130a may be formed on the first insulating layer 120 by using a deposition process such as CVD. Thereafter, the amorphous silicon layer 130a may be patterned using an additional mask or the like to form the opening OP.

Figure 5D:
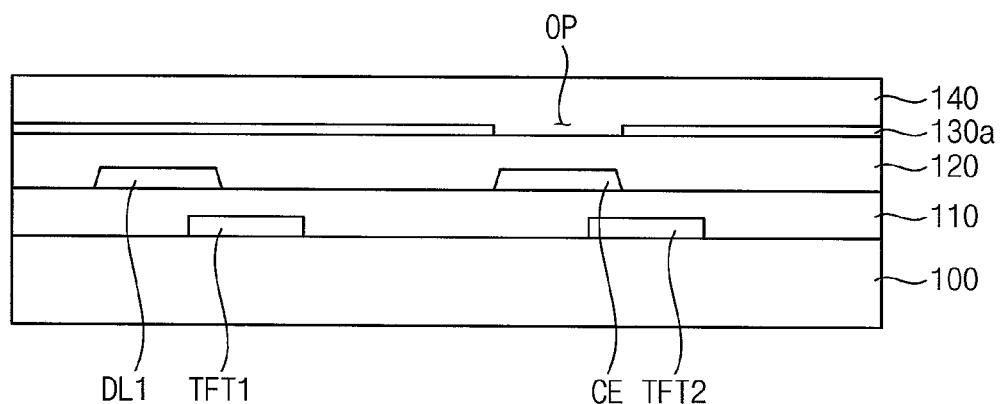

Referring to FIG. 5D, a second insulating layer 140 may be formed on the amorphous silicon layer 130a having the opening OP formed therein. The second insulating layer 140 may include an inorganic insulating material and may be formed through a deposition process such as CVD.

Figure 5E:
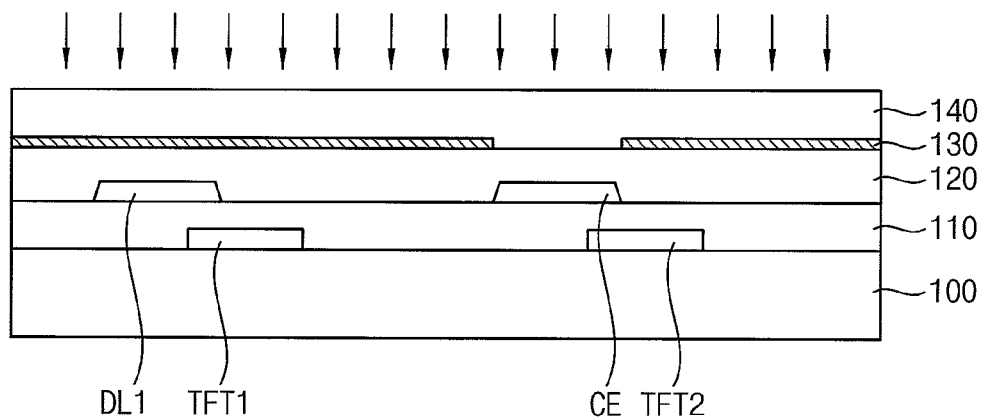

Referring to FIG. 5E, impurities may be provided (e.g. doped) to the amorphous silicon layer 130a through the second insulating layer 140 to form an impurity-doped amorphous silicon conductive layer 130. The amorphous silicon conductive layer 130 is doped with impurities to increase conductivity, and can serve as a conductive layer.

On the other hand, in the CDV process, a deposition process can be performed using plasma as described above, and a large amount of charge may be generated during the deposition process. This charge accumulates in the metal layer during the deposition process, and there arises a risk of arcing due to the accumulated charge. According to exemplary embodiments of the present invention, since the amorphous silicon conductive layer 130 is formed by doping the amorphous silicon layer after the amorphous silicon layer is formed, a display apparatus of excellent quality can be manufactured without problems.

Figure 5F:
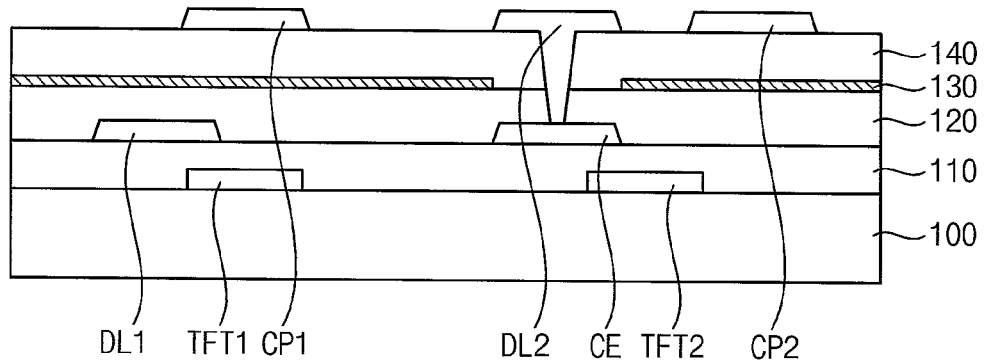

Referring to FIG. 5F, a contact hole exposing the connecting electrode CE may be formed through the second insulating layer 140 and the first insulating layer 120. A second data pattern may be formed on the second insulating layer 140 on which the contact holes are formed. The second data pattern may include a second data line DL2, a first contact pad CP1, and a second contact pad CP2.

Figure 5G:
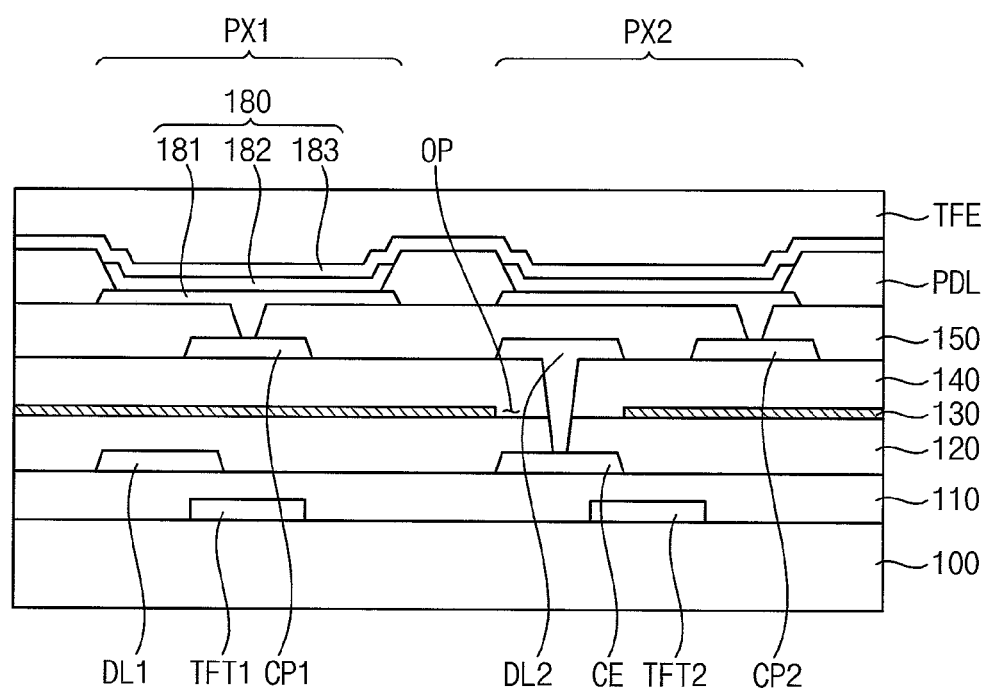

Referring to FIG. 5G, a via insulating layer 150 may be formed on the second insulating layer 140 on which the second data pattern is formed. A first electrode 181 may be formed on the via insulating layer 150. A pixel defining layer PDL may be formed on the via insulating layer 150 on which the first electrode 181 is formed. A light emitting layer 182 may be formed on the first electrode 181. A second electrode 183 may be formed on the light emitting layer 182. A thin film encapsulation layer TFE may be formed on the light emitting structure 180 including the first electrode 181, the light emitting layer 182, and the second electrode 183. Thus, the display apparatus can be manufactured.

FIGS. 6A to 6E are cross-sectional views illustrating a method of manufacturing the display apparatus of FIG. 4. The method is substantially the same as the method described with reference to FIGS. 5A to 5G, except for a connection structure between a second data line DL and a connecting electrode CE by a first contact hole CNT1 and a second contact hole CNT2. Therefore, repeated explanation will be omitted and to the extent that an explanation of various elements and features have been omitted, it may be assumed that these elements and features are at least similar to corresponding elements and features described elsewhere in the specification.

Figure 6A:
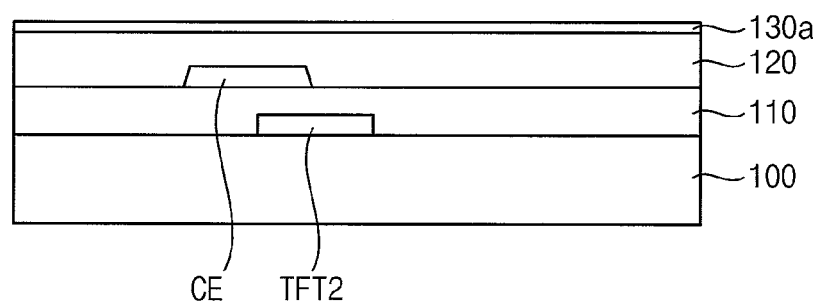
FIGS. 6A to 6E are cross-sectional views illustrating a method of manufacturing the display apparatus of FIG. 4.

Referring to FIG. 6A, a first thin film transistor and a second thin film transistor TFT2 may be formed on a base substrate 100. A thin film transistor insulating layer 120 may be formed on the base substrate 100 on which the first and second thin film transistors TFT2 are formed. A first data pattern may be formed on the thin film transistor insulating layer 120. The first data pattern may include a first data line and a connecting electrode CE. A first insulating layer 120 may be formed on the thin film transistor insulating layer 110 on which the first data pattern is formed. An amorphous silicon layer 130a may be formed on the first insulating layer 120

Figure 6B:
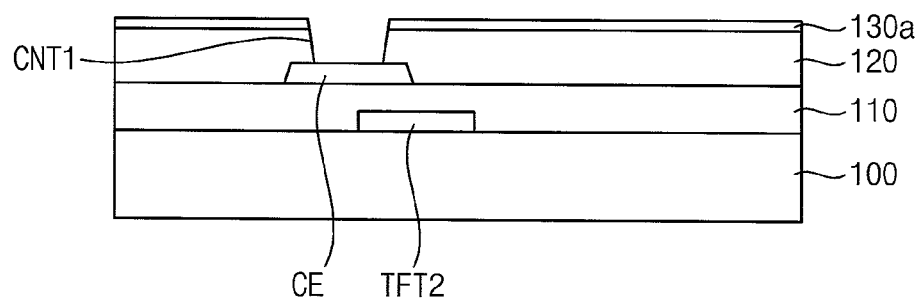

Referring to FIG. 6B, the amorphous silicon layer 130a and a portion of the first insulating layer 120 may be removed to form a first contact hole CNT1 exposing the connecting electrode CE.

Figure 6C:
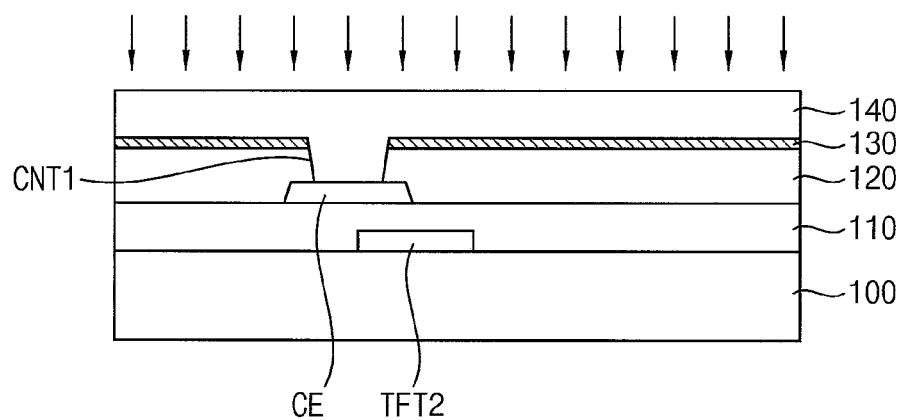

Referring to FIG. 6C, a second insulating layer 140 may be formed on the amorphous silicon layer 130a. Impurities may be provided to the amorphous silicon layer 130a through the second insulating layer 140 to form an impurity-doped amorphous silicon conductive layer 130.

Figure 6D:
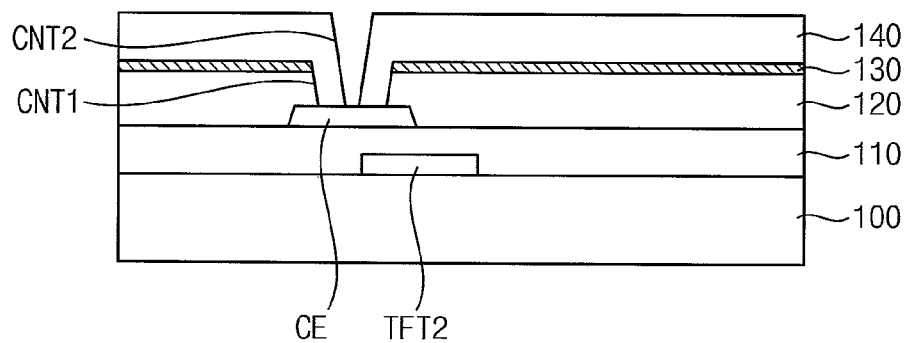

Referring to FIG. 6D, a second contact hole CNT2 may be formed in the first contact hole CNT1 to expose the connecting electrode CE through the second insulating layer 140.

Figure 6E:
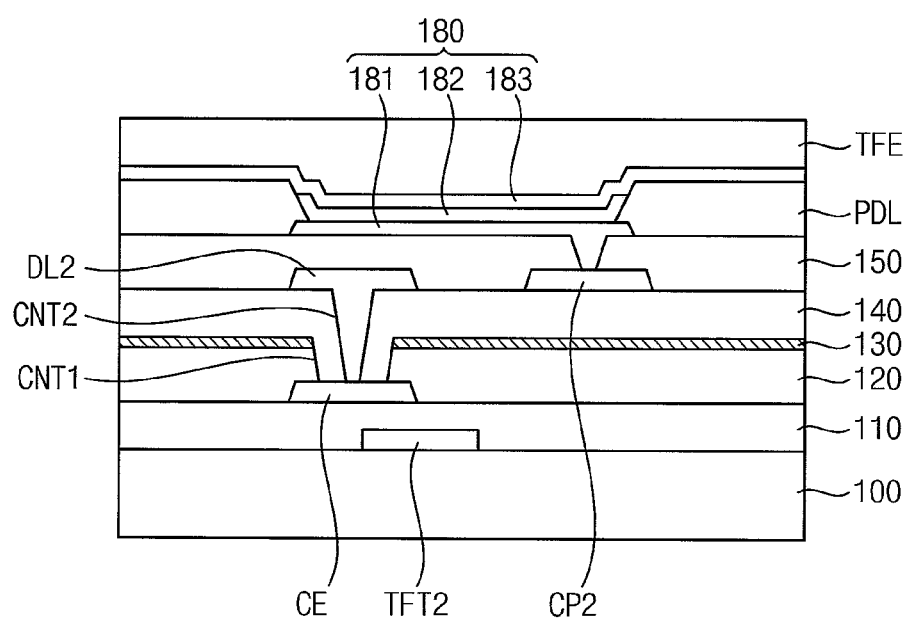

Referring to FIG. 6E, a second data pattern may be formed on the second insulating layer 140 on which the second contact hole CNT2 is formed. The second data pattern may include a second data line DL2, a first contact pad, and a second contact pad CP2.

After that, a via insulating layer 150, a first electrode 181, a pixel defining layer PDL, a light emitting layer 182, a second electrode 182, and a thin film encapsulation layer TFE may be formed, for example, in this order. Thus, the display apparatus may be manufactured.

Figure 7:
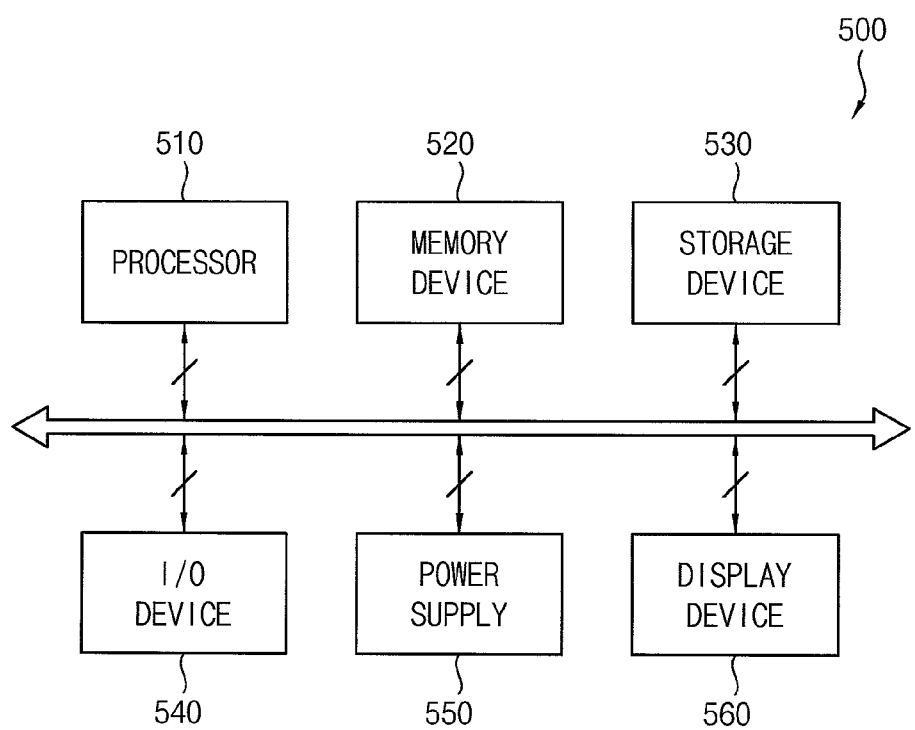
FIG. 7 is a block diagram illustrating an electronic device according to exemplary embodiments of the inventive concept.
Figure 8A:
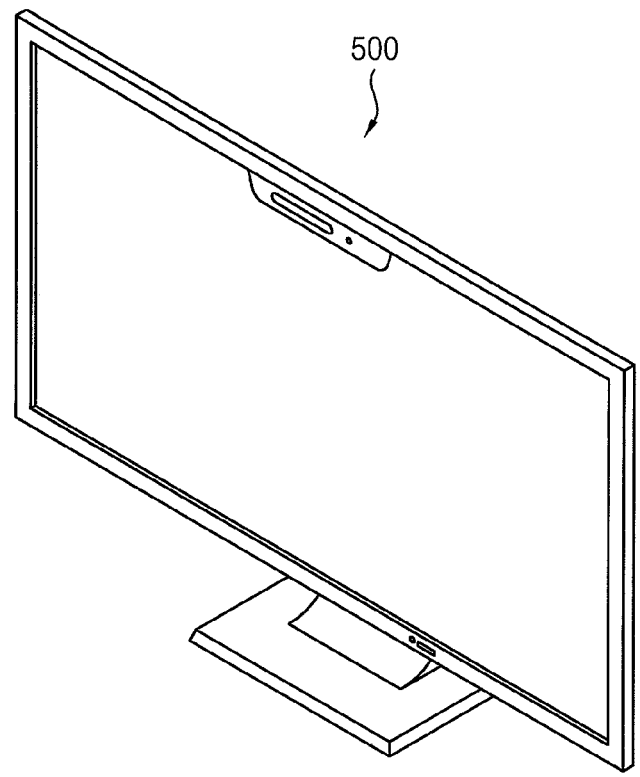
FIG. 8A is a diagram illustrating an example in which the electronic device of FIG. 7 is implemented as a television.
Figure 8B:
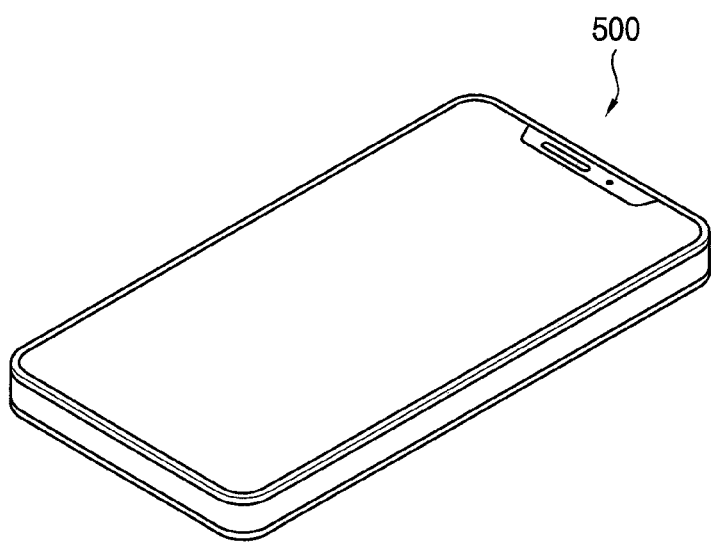
FIG. 8B is a diagram illustrating an example in which the electronic device of FIG. 7 is implemented as a smartphone.

FIG. 7 is a block diagram illustrating an electronic device according to exemplary embodiments of the present disclosure. FIG. 8A is a diagram illustrating an example in which the electronic device of FIG. 7 is implemented as a television. FIG. 8B is a diagram illustrating an example in which the electronic device of FIG. 7 is implemented as a smartphone.

Referring to FIGS. 7 through 8B, the electronic device 500 may include a processor 510, a memory device 520, a storage device 530, an input/output (I/O) device 540, a power supply 550, and a display device 560. Here, the display device 560 may correspond to the display apparatus of FIG. 1. In addition, the electronic device 500 may further include a plurality of ports for communicating with a video card, a sound card, a memory card, a universal serial bus (USB) device, other electronic devices, etc. In an exemplary embodiment of the present invention, as illustrated in FIG. 7A, the electronic device 500 may be implemented as a television. In an exemplary embodiment of the present invention, as illustrated in FIG. 7B, the electronic device 500 may be implemented as a smartphone. However, the electronic device 500 is not limited thereto. For example, the electronic device 500 may be implemented as a cellular phone, a video phone, a portable game console, a smartwatch, a tablet PC, a car navigation system, a computer monitor, a laptop/notebook computer, a head mounted display (HMD), another handheld electronic device, etc.

The processor 510 may perform various computing functions. The processor 510 may be a micro processor, a central processing unit (CPU), an application processor (AP), etc. The processor 510 may be coupled to other components via an address bus, a control bus, a data bus, etc. Further, the processor 510 may be coupled to an extended bus such as a peripheral component interconnection (PCI) bus. The memory device 520 may store data for the operation of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device such as a keyboard, a keypad, a mouse device, a touchpad, a touch-screen, etc and an output device such as a printer, a speaker, etc. The power supply 550 may provide power for operations of the electronic device 500.

The display device 560 may be coupled to other components via the buses or other communication links. In some exemplary embodiments of the present disclosure, the display device 560 may be included in the I/O device 540. As described above, the display device 560 includes an amorphous silicon conductive layer disposed between two adjacent data lines. A constant voltage of a predetermined level, such as a ground voltage, may be applied to the amorphous silicon conductive layer. Accordingly, it is possible to have a shielding effect for blocking the parasitic capacitance generated between the two data lines. However, since this has been described above, a duplicate description thereof will be omitted and to the extent that an explanation of various elements and features have been omitted, it may be assumed that these elements and features are at least similar to corresponding elements and features described elsewhere in the specification.

In addition, when a general metal thin film is used in place of the amorphous silicon conductive layer, the metal thin film should be formed to correspond to the entirety of the base substrate. Therefore, arcing phenomenon due to a large accumulation of charge may occur in a deposition process such as a chemical vapor deposition (CVD) process. However, according to exemplary embodiments of the present invention, since the amorphous silicon conductive layer is formed by doping impurities into the amorphous silicon layer after the amorphous silicon layer is formed, a high quality display apparatus can be manufactured without problems. However, since this has been described above, a duplicate description thereof will be omitted and to the extent that an explanation of various elements and features have been omitted, it may be assumed that these elements and features are at least similar to corresponding elements and features described elsewhere in the specification.

The present invention can be applied to organic light emitting display devices and various electronic devices including the same. For example, those devices listed above.

The foregoing is illustrative of the inventive concept and is not to be construed as limiting thereof. Although a few exemplary embodiments of the inventive concept have been described, those skilled in the art will readily appreciate that many modifications are possible in the exemplary embodiments without materially departing from the present inventive concept. Accordingly, all such modifications are intended to be included within the scope of the inventive concept.

What is claimed is:

1. A display apparatus, comprising:
   a base substrate;
   a first data line disposed on the base substrate;
   a first insulating layer disposed on both the first data line and the base substrate;
   an amorphous silicon conductive layer disposed on the first insulating layer;
   a second insulating layer disposed on the amorphous silicon conductive layer; and
   a second data line disposed on the second insulating layer.

2. The display apparatus of claim 1, wherein the amorphous silicon conductive layer includes an amorphous silicon layer doped with an impurity.

3. The display apparatus of claim 1, further comprising:
   a first thin film transistor and a second thin film transistor, each disposed on the base substrate; and
   a thin film transistor insulating layer disposed on both the first and second thin film transistors,
   wherein the first data line is disposed on the thin film transistor insulating layer and is electrically connected to the first thin film transistor, and
   wherein the second data line is electrically connected to the second thin film transistor.

4. The display apparatus of claim 3, wherein the amorphous silicon conductive layer is disposed between the first data line and the second data line.

5. The display apparatus of claim 3, further comprising:
   a connection electrode disposed between the first insulating layer and the thin film transistor insulating layer and is electrically connected to the second data line.

6. The display apparatus of claim 5, wherein the second data line is electrically connected to the connecting electrode through a contact hole which is formed through both the second insulating layer and the first insulating layer.

7. The display apparatus of claim 5, wherein a first contact hole is formed through both the first insulating layer and the amorphous silicon conductive layer to expose the connecting electrode,
wherein the second insulating layer is disposed in the first contact hole,
wherein a second contact hole is formed through the second insulating layer in the first contact hole, and
wherein the second data line is electrically connected to the connecting electrode through the second contact hole.

8. The display apparatus of claim 3, further comprising:
a first contact pad electrically connected to the first thin film transistor and a second contact pad electrically connected to the second thin film transistor, each of the first and second contact pads being disposed on the second insulating layer;
a via insulating layer disposed on both the first and second contact pads; and
a first light emitting structure electrically connected to the first contact pad and a second light emitting structure electrically connected to the second contact pad, the first and second light emitting structures each being disposed on the via insulating layer.

9. The display apparatus of claim 8, wherein the first light emitting structure comprises:
a first electrode electrically connected to the first thin film transistor and disposed on the via insulating layer;
a second electrode disposed on the first electrode; and
a light emitting layer disposed between the first electrode and the second electrode.

10. The display apparatus of claim 3, wherein the amorphous silicon conductive layer at least partially overlaps each of the first data line, the second data line, the first thin film transistor, and the second thin film transistor.

11. The display apparatus of claim 1, wherein the first data line partially overlaps the second data line.

12. The display apparatus of claim 1, wherein different data signals are applied to the first data line and the second data line.

13. The display apparatus of claim 1, wherein a constant voltage is applied to the amorphous silicon conductive layer.

14. A display apparatus, comprising:
a base substrate;
a first thin film transistor and a second thin film transistor each disposed on the base substrate;
a thin film transistor insulating layer disposed on both the first and second thin film transistors;
a first data line disposed on the thin film transistor insulating layer and electrically connected to the first thin film transistor;
a first insulating layer disposed on the first data line;
an amorphous silicon conductive layer disposed on the first insulating layer;
a second insulating layer disposed on the amorphous silicon conductive layer; and
a second data line disposed on the second insulating layer and electrically connected to the second thin film transistor.

15. A method of manufacturing a display apparatus, comprising:
forming first and second thin film transistors on a base substrate;
forming a thin film transistor insulating layer on the base substrate on which the first and second thin film transistors are formed;
forming a first data pattern, which comprises a first data line, on the thin film transistor insulating layer;
forming a first insulating layer on the first data pattern;
forming an amorphous silicon layer on the first insulating layer;
forming a second insulating layer on the amorphous silicon layer;
forming an amorphous silicon conductive layer by doping the amorphous silicon layer with an impurity; and
forming a second data pattern, which comprises a second data line, on the second insulating layer.

16. The method of claim 15, further comprising:
forming a first light emitting structure and a second light emitting structure on the second insulating layer on which the second data pattern is formed,
wherein the first light emitting structure is electrically connected to the first thin film transistor and the second light emitting structure is electrically connected to the second thin film transistor.

17. The method of claim 15, wherein the first data pattern further comprises a connecting electrode,
wherein in forming the amorphous silicon layer, an opening is formed through the amorphous silicon layer,
wherein the method further comprises forming a contact hole through the opening through the second insulating layer and the first insulating layer before forming the second data pattern, and
wherein the second data line is connected to the connecting electrode through the contact hole.

18. The method of claim 15, wherein the first data pattern further comprises a connecting electrode,
wherein the method further comprises:
forming a first contact hole by partially removing both the amorphous silicon layer and the first insulating layer after forming the amorphous silicon layer; and
forming a second contact hole in the first contact hole through the second insulating layer before forming the second data pattern, and
wherein the second data line is connected to the connecting electrode through the second contact hole.

19. The method of claim 15, wherein in forming the amorphous silicon layer, the amorphous silicon layer is formed over an entirety of the base substrate.

20. The method of claim 15, wherein the first data line partially overlaps the second data line.

* * * * *